(12) United States Patent
Chen et al.

(10) Patent No.: US 11,609,255 B1
(45) Date of Patent: Mar. 21, 2023

(54) SHIELDING BOX

(71) Applicant: Quanta Computer Inc., Taoyuan (TW)

(72) Inventors: Shuenn-Shyan Chen, Taoyuan (TW); Te-Wei Liu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/708,463

(22) Filed: Mar. 30, 2022

(30) Foreign Application Priority Data

Feb. 22, 2022 (TW) .................................. 111106329

(51) Int. Cl.
*G01R 31/10* (2006.01)
*G01R 29/10* (2006.01)

(52) U.S. Cl.
CPC .................................. *G01R 29/105* (2013.01)

(58) Field of Classification Search
CPC .. G01R 29/10; G01R 29/105; G01R 29/0814; G01R 29/0821; G01R 29/0878; G01R 29/0892; G01R 29/0871; G01R 31/001; G01R 1/0018
See application file for complete search history.

(56) References Cited

U.S. PATENT DOCUMENTS

| | | | |
|---|---|---|---|
| 5,532,704 A * | 7/1996 | Ruelle | G01R 29/105 343/703 |
| 11,506,697 B2 * | 11/2022 | Rehammar | H04B 17/0085 |
| 2015/0048980 A1 * | 2/2015 | Chin | G01R 1/045 343/703 |
| 2021/0190856 A1 * | 6/2021 | Shiota | G01R 31/2875 |

* cited by examiner

*Primary Examiner* — Thang X Le
(74) *Attorney, Agent, or Firm* — McClure, Qualey & Rodack, LLP

(57) ABSTRACT

A shielding box for testing a transmission antenna and a reception antenna includes a first box, a second box, a third box, and an absorption material. The transmission antenna is positioned in the first box. The reception antenna is positioned in the third box. The absorption material is distributed over the inner surfaces of the first box, the second box, and the third box, respectively. The third box is connected through the second box to the first box. The second box provides a relatively narrow connection path for reducing the multipath interference between the transmission antenna and the reception antenna.

10 Claims, 6 Drawing Sheets

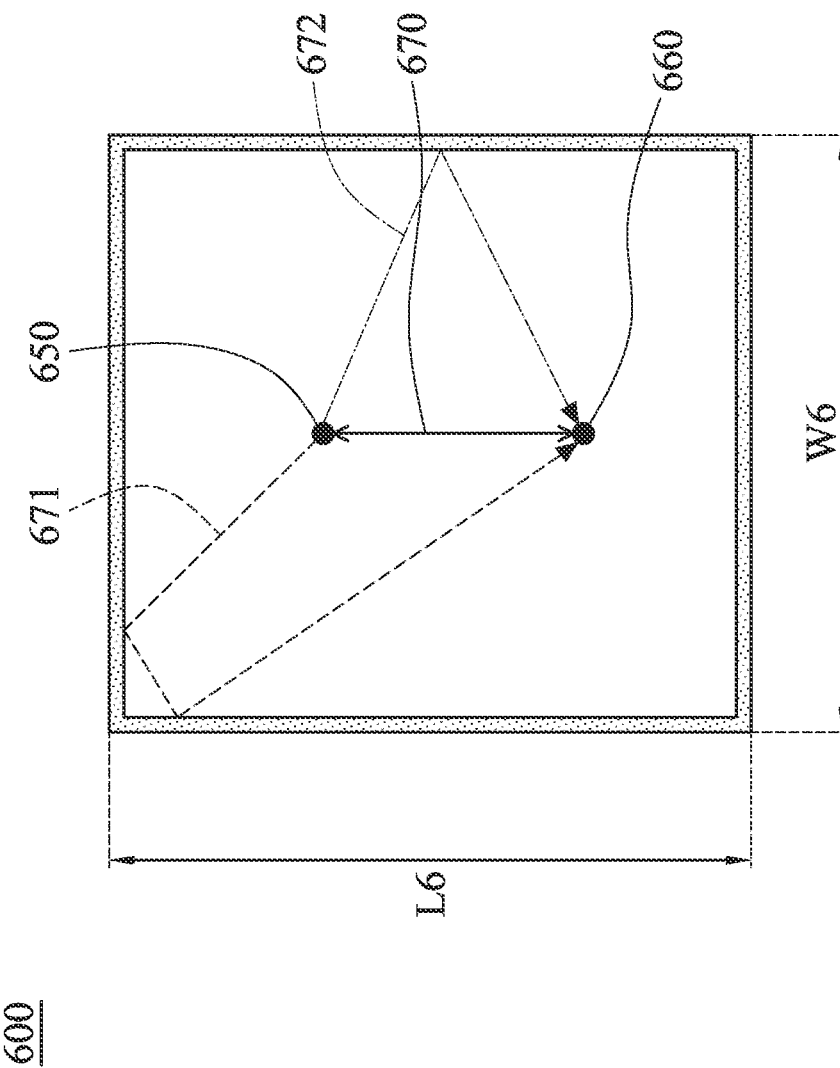

SHIELDING BOX

CROSS REFERENCE TO RELATED APPLICATIONS

This application claims priority of Taiwan Patent Application No. 111106329 filed on Feb. 22, 2022, the entirety of which is incorporated by reference herein.

BACKGROUND OF THE INVENTION

Field of the Invention

The disclosure generally relates to a shielding box, and more particularly, to a shielding box for reducing multipath interference.

Description of the Related Art

With the advancements being made in mobile communication technology, mobile devices such as portable computers, mobile phones, multimedia players, and other hybrid functional portable electronic devices have become more common. To satisfy consumer demand, mobile devices can usually perform wireless communication functions. Some devices cover a large wireless communication area; these include mobile phones using 2G, 3G, and LTE (Long Term Evolution) systems and using frequency bands of 700 MHz, 850 MHz, 900 MHz, 1800 MHz, 1900 MHz, 2100 MHz, 2300 MHz, and 2500 MHz. Some devices cover a small wireless communication area; these include mobile phones using Wi-Fi systems and using frequency bands of 2.4 GHz, 5.2 GHz, and 5.8 GHz.

Antennas are indispensable elements for wireless communication. When an antenna is practically under test, an anechoic chamber is usually used for reducing multipath interference. However, the space occupied by the anechoic chamber is very large, which causes much design inconvenience. Accordingly, there is a need to propose a novel solution for solving the problems of the prior art.

BRIEF SUMMARY OF THE INVENTION

In an exemplary embodiment, the invention is directed to a shielding box for testing a transmission antenna and a reception antenna. The shielding box includes a first box, a second box, a third box, and an absorption material. The transmission antenna is positioned in the first box. The reception antenna is positioned in the third box. The absorption material is distributed over the inner surfaces of the first box, the second box, and the third box, respectively. The third box is connected through the second box to the first box. The second box provides a relatively narrow connection path for reducing the multipath interference between the transmission antenna and the reception antenna.

In some embodiments, the first box and the third box are asymmetrical.

In some embodiments, the shielding box substantially has a pentagonal shape.

In some embodiments, the combination of the first box, the second box, and the third box includes a first exterior wall, a second exterior wall, a third exterior wall, a fourth exterior wall, and a fifth exterior wall. A closed loop is formed by the first exterior wall, the second exterior wall, the third exterior wall, the fourth exterior wall, and the fifth exterior wall. Any two of the first exterior wall, the second exterior wall, the third exterior wall, the fourth exterior wall, and the fifth exterior wall are not parallel to each other.

In some embodiments, the shielding box further includes a first partition plate and a second partition plate. The first partition plate and the second partition plate are disposed between the first box and the second box. A first connection hole is formed between the first partition plate and the second partition plate.

In some embodiments, the shielding box further includes a third partition plate and a fourth partition plate. The third partition plate and the fourth partition plate are disposed between the second box and the third box. A second connection hole is formed between the third partition plate and the fourth partition plate. The connection path passes through the first connection hole and the second connection hole.

In some embodiments, the shielding box substantially has a dumbbell shape.

In some embodiments, the first box substantially has a first circular shape. The transmission antenna is substantially positioned at the center of the first circular shape. The third box substantially has a second circular shape. The reception antenna is substantially positioned at the center of the second circular shape.

In some embodiments, the shielding box further includes a first metal element and a second metal element. The first metal element is disposed in the first box. The second metal element is disposed on the third box. The first metal element and the second metal element are configured to destroy the symmetry of the first box and the third box.

In some embodiments, the length of each of the first box, the second box, and the third box is from 35 cm to 65 cm.

BRIEF DESCRIPTION OF DRAWINGS

The invention can be more fully understood by reading the subsequent detailed description and examples with references made to the accompanying drawings, wherein:

FIG. 6 is a sectional view of a conventional anechoic chamber.

DETAILED DESCRIPTION OF THE INVENTION

Figure 1:
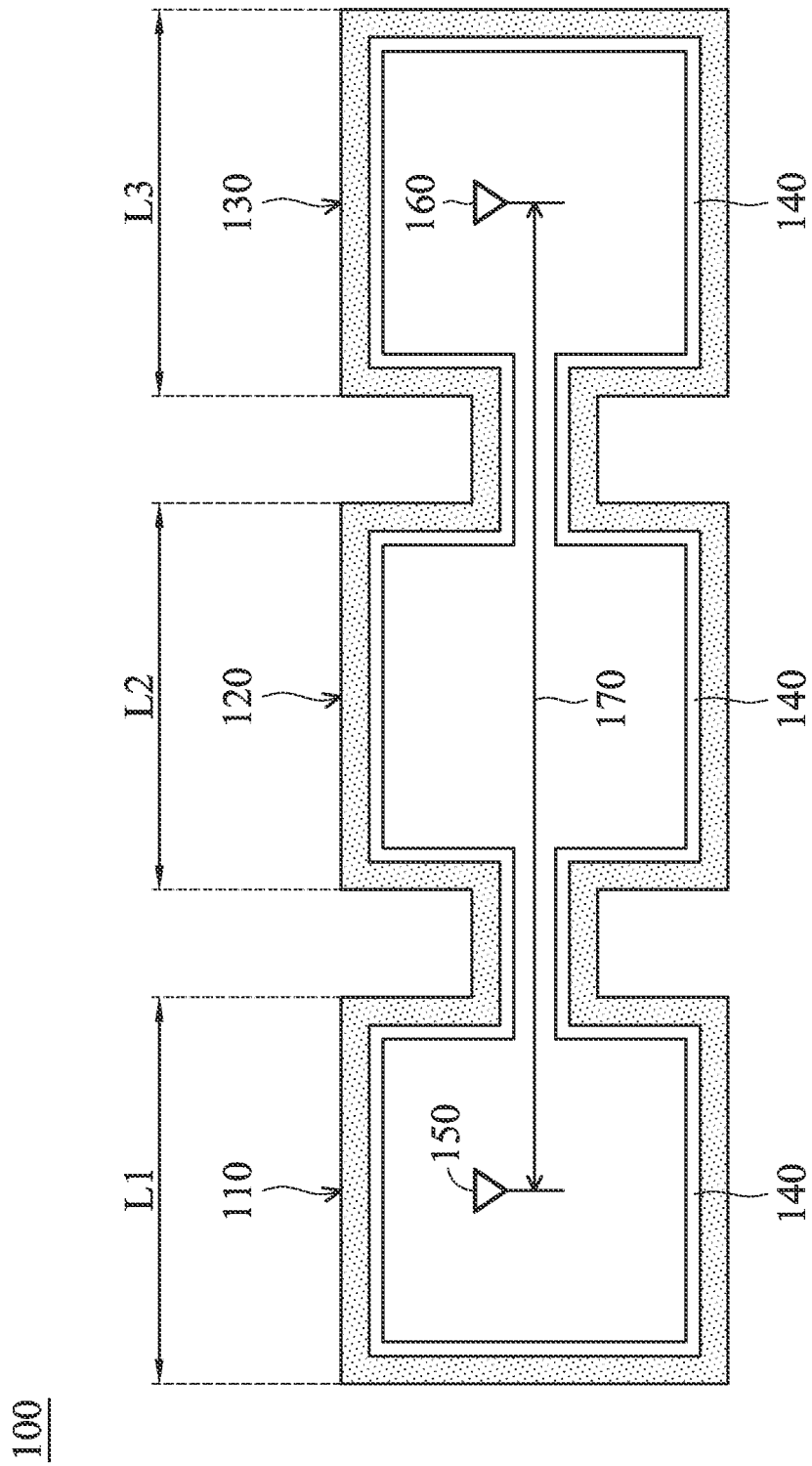
FIG. 1 is a diagram of a shielding box according to an embodiment of the invention.

In order to illustrate the purposes, features and advantages of the invention, the embodiments and figures of the invention are shown in detail as follows.

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". The term "substantially" means the value is within an acceptable error range.

One skilled in the art can solve the technical problem within a predetermined error range and achieve the proposed technical performance. Also, the term "couple" is intended to mean either an indirect or direct electrical connection. Accordingly, if one device is coupled to another device, that connection may be through a direct electrical connection, or through an indirect electrical connection via other devices and connections.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a diagram of a shielding box 100 according to an embodiment of the invention. The shielding box 100 is configured to test a transmission antenna 150 and a reception antenna 160. The shapes and types of the transmission antenna 150 and the reception antenna 160 are not limited in the invention. For example, any of the transmission antenna 150 and the reception antenna 160 may be a monopole antenna, a dipole antenna, a loop antenna, a patch antenna, a PIFA (Planar Inverted F Antenna), or a chip antenna. It should be understood that the transmission antenna 150 and the reception antenna 160 are merely testing components, which are not any portion of the shielding box 100.

As shown in FIG. 1, the shielding box 100 includes a first box 110, a second box 120, a third box 130, and an absorption material 140. The shapes and styles of the first box 110, the second box 120, and the third box 130 are not limited in the invention. Specifically, each of the first box 110, the second box 120, and the third box 130 may be a metal cavity. The third box 130 is connected through the second box 120 to the first box 110. That is, the internal space of the first box 110, the internal space of the second box 120, and the internal space of the third box 130 may be connected to each other. The transmission antenna 150 is positioned in the first box 110. The reception antenna 160 is positioned in the third box 130. The absorption material 140 is distributed over the inner surfaces of the first box 110, the second box 120, and the third box 130, respectively, so as to reduce a variety of reflections of electromagnetic waves. In some embodiments, the absorption material 140 has a smooth surface. In alternative embodiments, the absorption material 140 has a serrated surface.

It should be noted that the second box 120 provides a relatively narrow connection path 170 for reducing the multipath interference between the transmission antenna 150 and the reception antenna 160. In other word, the connection path 170 is considered as an LOS (Line of Sight) between the transmission antenna 150 and the reception antenna 160. With such a design, electromagnetic waves are substantially transmitted between the transmission antenna 150 and the reception antenna 160 using the connection path 170. The impact of the other NLOS (Non-line of Sight) transmission paths is almost negligible in the shielding box 100. According to practical measurements, the shielding box 100 can effectively suppress the multipath interference between the transmission antenna 150 and the reception antenna 160 when the length L1 of the first box 110, the length L2 of the second box 120, and the length L3 of the third box 130 are all from 35 cm to 65 cm (e.g., equal to 50 cm). The total size of the proposed shielding box 100 of the invention can be significantly reduced in comparison to that of a conventional anechoic chamber (whose length, width and height are all longer than 400 cm), and therefore it is suitable for applications in a variety of actual production lines.

The following embodiments will introduce different configurations and detail structural features of the shielding box 100. It should be understood that these figures and descriptions are merely exemplary, rather than limitations of the invention.

Figure 2:
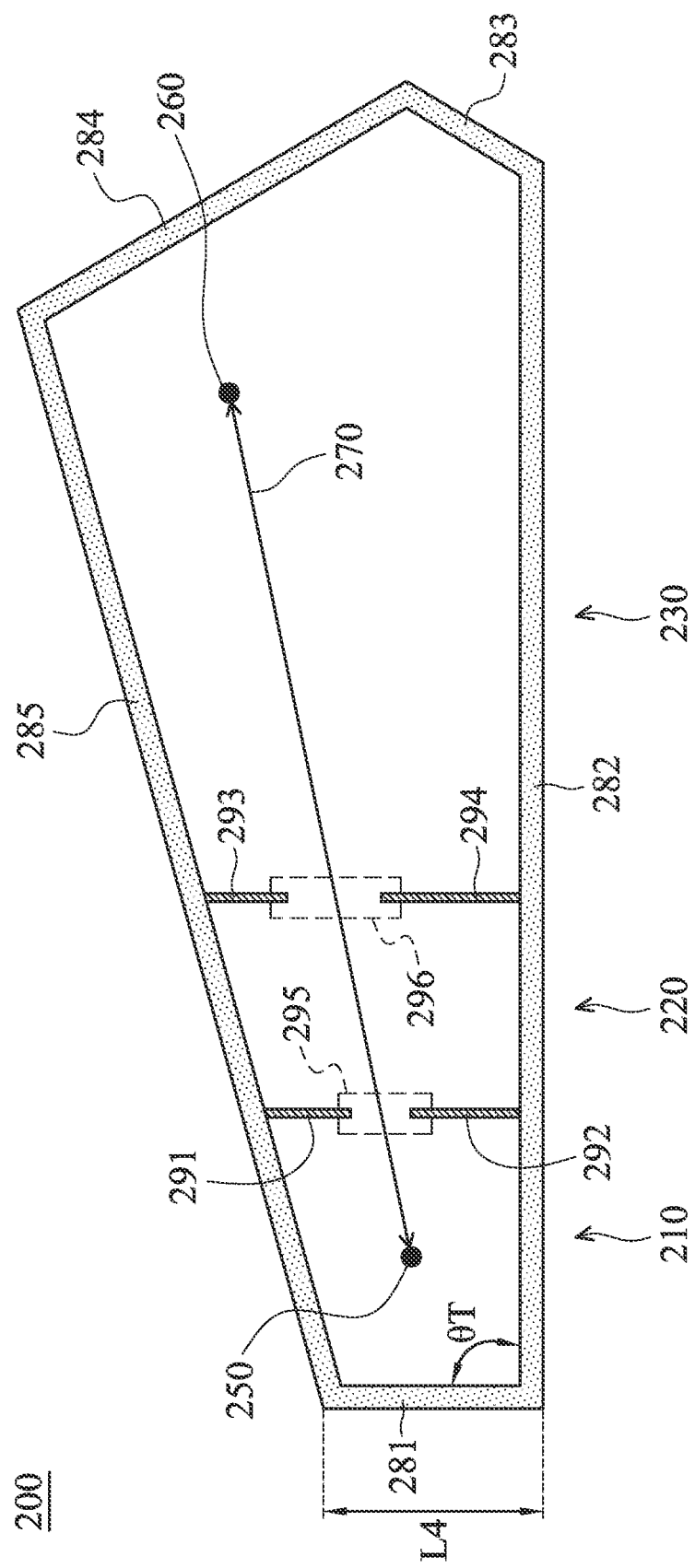
FIG. 2 is a sectional view of a shielding box according to an embodiment of the invention.

FIG. 2 is a sectional view of a shielding box 200 according to an embodiment of the invention. For example, the shielding box 200 may substantially have a pentagonal shape. In the embodiment of FIG. 2, the shielding box 200 at least includes a first box 210, a second box 220, and a third box 230. The third box 230 is connected through the second box 220 to the first box 210. The second box 220 provides a relatively narrow connection path 270. Moreover, the shielding box 200 may further includes an absorption material (not shown), which is distributed over the inner surfaces of the first box 210, the second box 220, and the third box 230, respectively.

Specifically, the combination of the first box 210, the second box 220, and the third box 230 includes a first exterior wall 281, a second exterior wall 282, a third exterior wall 283, a fourth exterior wall 284, and a fifth exterior wall 285, which may all be made of metal materials. A closed loop is formed by the first exterior wall 281, the second exterior wall 282, the third exterior wall 283, the fourth exterior wall 284, and the fifth exterior wall 285. It should be noted that any two of the first exterior wall 281, the second exterior wall 282, the third exterior wall 283, the fourth exterior wall 284, and the fifth exterior wall 285 are not parallel to each other. Thus, the first box 210 and the third box 230 are asymmetrical. In some embodiments, the first exterior wall 281 of the first box 210 is the shortest among all of the exterior walls. The length L4 of the first exterior wall 281 may be from 35 cm to 65 cm (e.g., equal to 50 cm). In some embodiments, a right angle θT is formed between the first exterior wall 281 and the second exterior wall 282, which is the smallest angle between all of the adjacent exterior walls.

In addition, the shielding box 200 may further include a first partition plate 291, a second partition plate 292, a third partition plate 293, and a fourth partition plate 294, which are all made of metal materials. The first partition plate 291 and the third partition plate 293 are coupled to the fifth exterior wall 285. The first partition plate 291 and the third partition plate 293 are substantially parallel to each other.

The second partition plate 292 and the fourth partition plate 294 are coupled to the second exterior wall 282. The second partition plate 292 and the fourth partition plate 294 are substantially parallel to each other. Specifically, the first partition plate 291 and the second partition plate 292 are disposed between the first box 210 and the second box 220. A first connection hole 295 is formed between the first partition plate 291 and the second partition plate 292. The third partition plate 293 and the fourth partition plate 294 are disposed between the second box 220 and the third box 230. A second connection hole 296 is formed between the third partition plate 293 and the fourth partition plate 294. It should be noted that the connection path 270 passes through both of the first connection hole 295 and the second connection hole 296. Since a transmission antenna 250 is positioned in the first box 210 and a reception antenna 260 is positioned in the third box 230, the aforementioned connection path 270 is used as an LOS between the transmission antenna 250 and the reception antenna 260.

Figure 3:
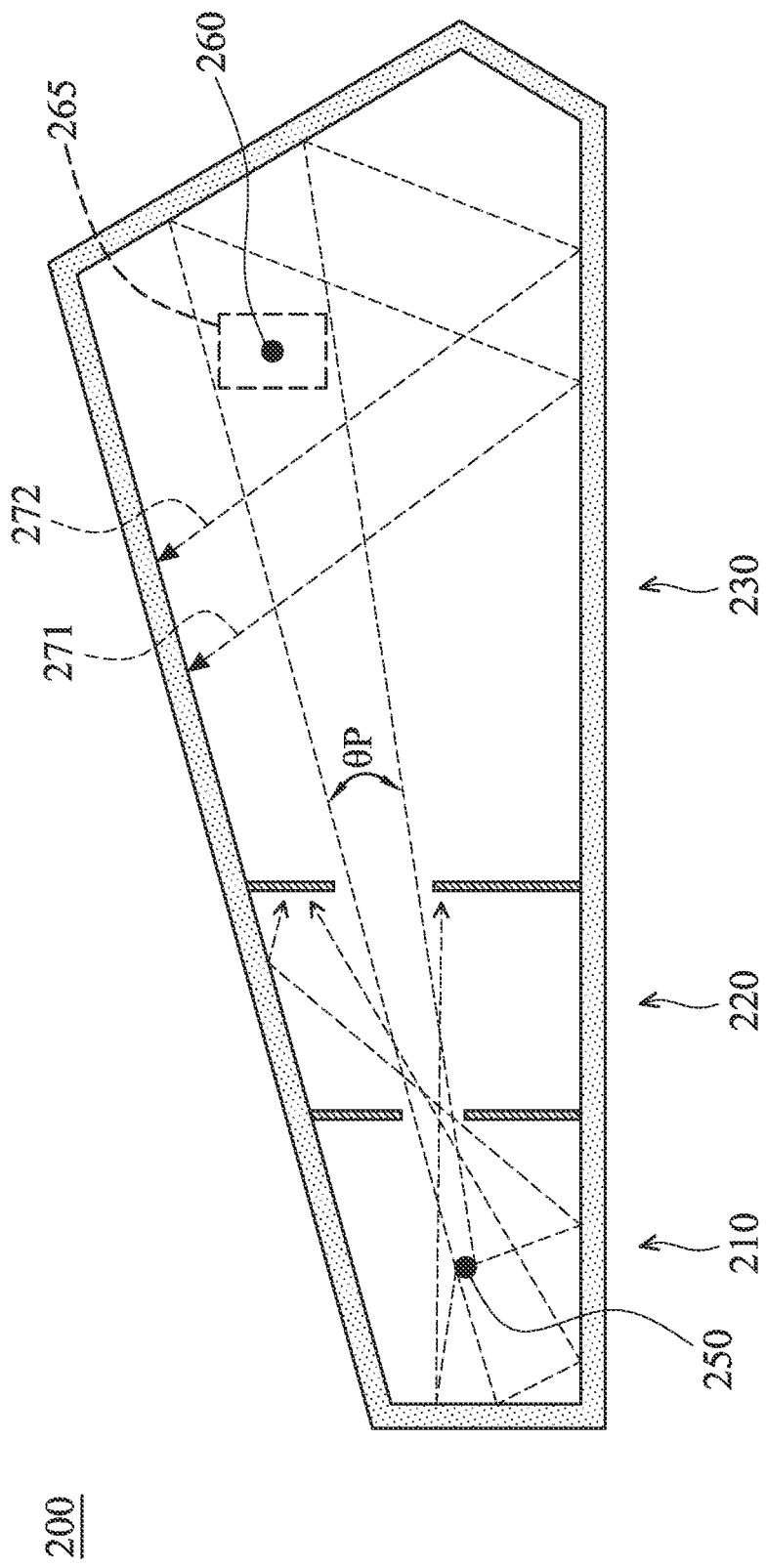
FIG. 3 is a diagram of reflection paths of a shielding box according to an embodiment of the invention.

FIG. 3 is a diagram of reflection paths of the shielding box 200 according to an embodiment of the invention. When the transmission antenna 250 in the first box 210 is excited to generate electromagnetic waves, besides the connection path 270, the electromagnetic waves can be transmitted along a first reflective path 271 and a second reflective path 272. In addition, there may be more reflective paths (not shown) existing between the first reflective path 271 and the second reflective path 272. It should be noted that neither the first reflective path 271 nor the second reflective path 272 passes through a quiet zone 265 in the third box 230. The reception antenna 260 may be disposed inside the quiet zone 265. With such a design, the electromagnetic waves are substantially transmitted between the transmission antenna 250 and the reception antenna 260 using the LOS connection path 270. In some embodiments, there is a transmission angle θP formed between the first reflective path 271 and the second reflective path 272. The impact of the NLOS transmission paths is almost negligible in the shielding box 200 because the transmission angle θP is smaller than or equal to 30 degrees. That is, the NLOS transmission paths are almost blocked by the first partition plate 291, the second partition plate 292, the third partition plate 293, and the fourth partition plate 294 of the shielding box, thereby reducing the multipath interference between the transmission antenna 250 and the reception antenna 260.

Figure 4:
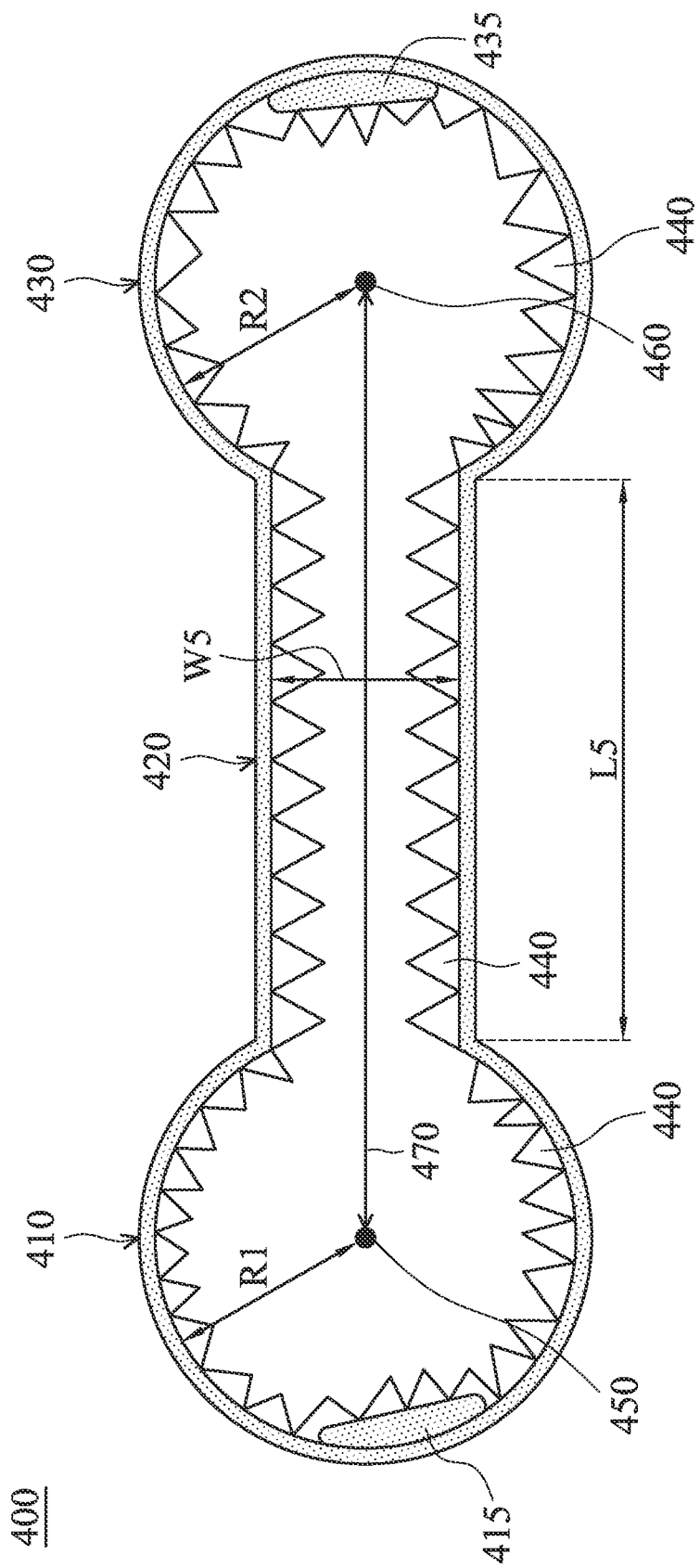
FIG. 4 is a sectional view of a shielding box according to an embodiment of the invention.

FIG. 4 is a sectional view of a shielding box 400 according to an embodiment of the invention. For example, the shielding box 400 may substantially have a dumbbell shape. In the embodiment of FIG. 4, the shielding box 400 at least includes a first box 410, a second box 420, a third box 430, and an absorption material 440. The third box 430 is connected through the second box 420 to the first box 410. The second box 420 provides a relatively narrow connection path 470. The absorption material 440 may substantially have a serrated shape, and it is distributed over the inner surfaces of the first box 410, the second box 420, and the third box 430, respectively.

Specifically, the first box 410 substantially may have a first circular shape. A transmission antenna 450 is substantially positioned at the center of the first circular shape. The third box 430 may substantially have a second circular shape. A reception antenna 460 is substantially positioned at the center of the second circular shape. Thus, the aforementioned connection path 470 is used as an LOS between the transmission antenna 450 and the reception antenna 460. In some embodiments, the shielding box 400 further includes a first metal element 415 and a second metal element 435.

The first metal element 415 is disposed in the first box 410. The second metal element 435 is disposed in the third box 430. For example, each of first metal element 415 and the second metal element 435 may substantially have a bow shape, but it is not limited thereto.

Figure 5:
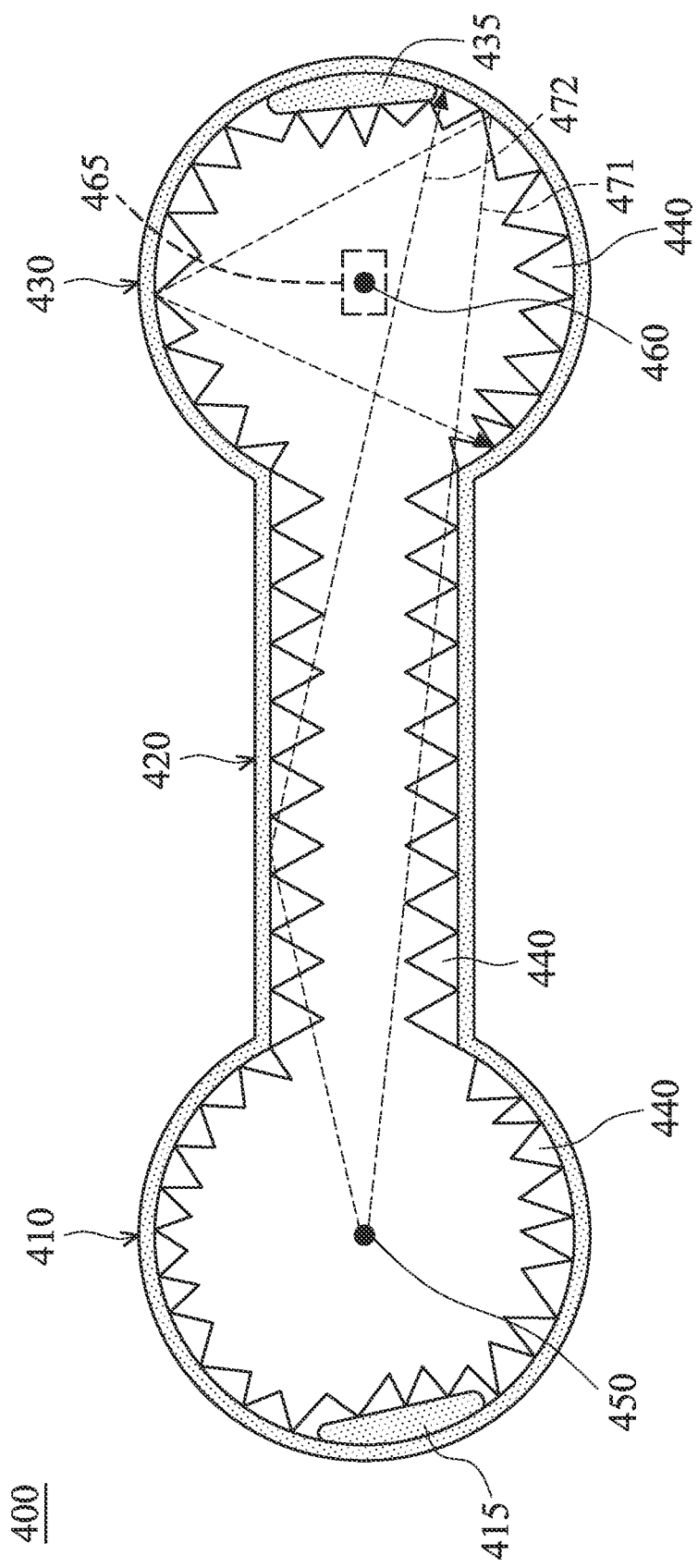
FIG. 5 is a diagram of reflection paths of a shielding box according to an embodiment of the invention.

FIG. 5 is a diagram of reflection paths of the shielding box 400 according to an embodiment of the invention. When the transmission antenna 450 in the first box 410 is excited to generate electromagnetic waves, besides the connection path 470, the electromagnetic waves can be transmitted along a first reflective path 471 and a second reflective path 472. In addition, there may be more reflective paths (not shown) existing between the first reflective path 471 and the second reflective path 472. It should be noted that neither the first reflective path 471 nor the second reflective path 472 passes through a quiet zone 465 in the third box 430. The reception antenna 460 may be disposed inside the quiet zone 465. With such a design, the electromagnetic waves are substantially transmitted between the transmission antenna 450 and the reception antenna 460 using the LOS connection path 470. The impact of NLOS transmission paths is almost negligible in the shielding box 400. According to practical measurements, the first metal element 415 and the second metal element 435 are configured to destroy the symmetry of the first box 410 and the third box 430, thereby further suppressing the multipath interference between the transmission antenna 450 and the reception antenna 460.

In some embodiments, the radius R1 of the first box 410 may be from 35 cm to 65 cm (e.g., equal to 50 cm). The length L5 of the second box 420 may be from 35 cm to 65 cm (e.g., equal to 50 cm). The radius R2 of the third box 430 may be from 35 cm to 65 cm (e.g., equal to 50 cm). Furthermore, the width W5 of the second box 420 may be shorter than or equal to the radius R1 of the first box 410 (or the radius R2 of the third box 430). The above ranges of element sizes are calculated and obtained according to many experiment results, and they help to minimize the multipath interference in the shielding box 400.

FIG. 6 is a sectional view of a conventional anechoic chamber 600. As shown in FIG. 6, when a transmission antenna 650 transmits electromagnetic waves to a reception antenna 660 in the conventional anechoic chamber 600, there may be many transmission paths 670, 671 and 672 existing concurrently, which may degrade the accuracy of antenna testing. In addition, the length L6 and the width W6 of the conventional anechoic chamber 600 are usually designed to be at least 400 cm. Therefore, the proposed small-size shielding box 100, 200 and 400 of the invention can overcome the aforementioned drawbacks of the conventional anechoic chamber 600.

The invention proposes a novel shielding box. In comparison to the conventional design, the invention has at least the advantages of minimizing the total size, suppressing the multipath interference, and reducing the manufacturing cost. Therefore, the invention is suitable for application in a variety of antenna testing devices.

Note that the above element sizes and element parameters are not limitations of the invention. A designer can fine-tune these settings or values according to different requirements. It should be understood that the shielding box of the invention is not limited to the configurations of FIGS. 1-5. The invention may merely include any one or more features of any one or more embodiments of FIGS. 1-5. In other words, not all of the features displayed in the figures should be implemented in the shielding box of the invention.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A shielding box for testing a transmission antenna and a reception antenna, comprising:
   a first box, wherein the transmission antenna is positioned in the first box;
   a second box;
   a third box, wherein the reception antenna is positioned in the third box; and
   an absorption material, distributed over inner surfaces of the first box, the second box, and the third box, respectively;
   wherein the third box is connected through the second box to the first box;
   wherein the second box provides a relatively narrow connection path for reducing multipath interference between the transmission antenna and the reception antenna.

2. The shielding box as claimed in claim 1, wherein the first box and the third box are asymmetrical.

3. The shielding box as claimed in claim 1, wherein the shielding box substantially has a pentagonal shape.

4. The shielding box as claimed in claim 1, wherein a combination of the first box, the second box, and the third box comprises:
   a first exterior wall;
   a second exterior wall;
   a third exterior wall;
   a fourth exterior wall; and
   a fifth exterior wall, wherein a closed loop is formed by the first exterior wall, the second exterior wall, the third exterior wall, the fourth exterior wall, and the fifth exterior wall;
   wherein any two of the first exterior wall, the second exterior wall, the third exterior wall, the fourth exterior wall, and the fifth exterior wall are not parallel to each other.

5. The shielding box as claimed in claim 1, further comprising:
   a first partition plate; and
   a second partition plate, wherein the first partition plate and the second partition plate are disposed between the first box and the second box, and wherein a first connection hole is formed between the first partition plate and the second partition plate.

6. The shielding box as claimed in claim 5, further comprising:
   a third partition plate; and
   a fourth partition plate, wherein the third partition plate and the fourth partition plate are disposed between the second box and the third box, and wherein a second connection hole is formed between the third partition plate and the fourth partition plate;
   wherein the connection path passes through the first connection hole and the second connection hole.

7. The shielding box as claimed in claim 1, wherein the shielding box substantially has a dumbbell shape.

8. The shielding box as claimed in claim 1, wherein the first box substantially has a first circular shape, the transmission antenna is substantially positioned at a center of the first circular shape, the third box substantially has a second circular shape, and the reception antenna is substantially positioned at a center of the second circular shape.

9. The shielding box as claimed in claim 1, further comprising:
   a first metal element, disposed in the first box; and
   a second metal element, disposed on the third box, wherein the first metal element and the second metal element are configured to destroy symmetry of the first box and the third box.

10. The shielding box as claimed in claim 1, wherein a length of each of the first box, the second box, and the third box is from 35 cm to 65 cm.

* * * * *